(12) United States Patent
Su

(10) Patent No.: US 7,714,349 B2
(45) Date of Patent: May 11, 2010

(54) PACKAGE STRUCTURE FOR ESD PROTECTION OF LIGHT-EMITTING DEVICE

(75) Inventor: Wen-Lung Su, Nantou County (TW)

(73) Assignee: LightHouse Technology Co., Ltd, Hsin-Chu Hsien (TW)

( * ) Notice: Subject to any disclaimer, the term of this patent is extended or adjusted under 35 U.S.C. 154(b) by 414 days.

(21) Appl. No.: 11/684,644

(22) Filed: Mar. 12, 2007

(65) Prior Publication Data
US 2008/0142831 A1 Jun. 19, 2008

(30) Foreign Application Priority Data
Dec. 18, 2006 (TW) .............................. 95222255 U

(51) Int. Cl.
*H01L 33/54* (2010.01)
(52) U.S. Cl. ........... 257/99; 257/E33.059; 257/E33.066
(58) Field of Classification Search .................. 257/98, 257/99, 100, 687, 693, 724, E33.056–E33.059, 257/E33.066
See application file for complete search history.

(56) References Cited
U.S. PATENT DOCUMENTS
6,054,716 A * 4/2000 Sonobe et al. .............. 250/552

2004/0056265 A1* 3/2004 Arndt et al. ................... 257/98
2007/0018191 A1* 1/2007 Roh et al. ..................... 257/99

FOREIGN PATENT DOCUMENTS
JP 2002029844 1/2002
JP 2002029868 1/2002

* cited by examiner

*Primary Examiner*—Minh-Loan T Tran
*Assistant Examiner*—W. Wendy Kuo
(74) *Attorney, Agent, or Firm*—Jianq Chyun IP Office

(57) ABSTRACT

A package structure including a first lead, a second lead, an encapsulant, a light-emitting device and an electrostatic discharge (ESD) protection device is provided. The second lead is disposed beside the first lead, and parts of the first lead and the second lead are encapsulated by the encapsulant. The encapsulant has a first cavity and a second cavity. Parts of the first lead and the second lead are exposed by the first cavity and the other parts of the first lead and the second lead are exposed by the second cavity. The light-emitting device is disposed inside the first cavity and electrically connected to the first lead and the second lead. The ESD protection device is disposed inside the second cavity and electrically connected to the first lead and the second lead.

11 Claims, 3 Drawing Sheets

PACKAGE STRUCTURE FOR ESD PROTECTION OF LIGHT-EMITTING DEVICE

CROSS-REFERENCE TO RELATED APPLICATION

This application claims the priority benefit of Taiwan application serial no. 95222255, filed Dec. 18, 2006. All disclosure of the Taiwan application is incorporated herein by reference.

BACKGROUND OF THE INVENTION

1. Field of Invention

The present invention generally relates to a package structure, and particularly to a package structure of a light-emitting device.

2. Description of Related Art

In comparison with conventional bulbs, the light-emitting diodes (LEDs) are characterized by compactness, long lifetime, low power consumption, free of mercury (non-pollution), and so on. With advancement of luminance efficiency, applications of fluorescent lamps and incandescent bulbs are gradually replaced with LEDs in some areas. For example, the LEDs have been employed to high-speed light sources of scanners, back light sources of liquid crystal displays (LCDs), illumination of the instrument panels, traffic signs and general illumination devices.

Despite the aforesaid advantages, the LEDs are often damaged by abnormal voltages or electrostatic discharge (ESD). Conventionally, the LED and a Zener diode are connected in parallel to prevent the LED from being damaged by the abnormal voltage or ESD.

FIG. 1A is a top view depicting a conventional LED package structure, while FIG. 1B is a cross-sectional view of the LED package structure of FIG. 1A. Referring to FIGS. 14 and 1B, the conventional LED package structure 100 includes a first lead 110, a second lead 120, an encapsulant 130, an LED chip 140, and a Zener diode 150. The first lead 110 is disposed beside the second lead 120, and parts of the first lead 110 and the second lead 120 are packaged by the encapsulant 130. The encapsulant 130 has a cavity 132 SO as to expose parts of the first lead 110 and the second lead 120.

In addition, the LED chip 140 is disposed on the first lead 110 within the cavity 132. A cathode of the LED chip 140 is electrically connected to the first lead 110 through a wire 162 while an anode thereof is electrically connected to the second lead 120 through a wire 164. The Zener diode 150 is disposed on the second lead 120 within the cavity 132. The cathode of the Zener diode 150 is electrically connected to the second lead 120 directly while the anode thereof is electrically connected to the first lead 110 through a wire 166.

According to the prior art, the disposition of the Zener diode 150 prevents the LED chip 140 from being damaged by ESD. However, the Zener diode 150 blocks parts of the light emitted by the LED chip 140, which deteriorates the luminescence efficiency of the LED package structure 100.

SUMMARY OF THE INVENTION

The present invention relates to a package structure featuring superior luminance efficiency.

The present invention provides a package structure including a first lead, a second lead, an encapsulant, a light-emitting device and an electrostatic discharge (ESD) protection device. The second lead is disposed beside the first lead, and parts of the first lead and the second lead are packaged by the encapsulant. The encapsulant has a first cavity and a second cavity. Here, parts of the first lead and the second lead are exposed by the first cavity and the other parts of the first lead and the second lead are exposed by the second cavity. The light-emitting device is disposed inside the first cavity and electrically connected to the first lead and the second lead. The ESD protection device is disposed inside the second cavity and electrically connected to the first lead and the second lead.

According to the aforesaid package structure, the light-emitting device is, for example, disposed on the first lead, and the ESD protection device is, for example, disposed on the second lead.

The aforesaid package structure further includes two wires, and a first contact pad and a second contact pad are disposed on a top of the light-emitting device. Here, the wires are connected between the first contact pad and the first lead and connected between the second contact pad and the second lead.

The aforesaid package structure further includes a wire, and a third contact pad and a fourth contact pad are respectively disposed on a bottom and a top of the ESD protection device. Here, the third contact pad is in contact with the second lead and the wire is connected between the fourth contact pad and the first lead.

According to the aforesaid package structure, the ESD protection device is, for example, a diode.

According to the aforesaid package structure, the diode may be a Zener diode or an LED.

According to the aforesaid package structure, the light-emitting device may be an LED chip.

The aforesaid package structure further includes a compound encapsulating the first cavity, for example.

The aforesaid package structure further includes a compound encapsulating the second cavity, for example.

According to the aforesaid package structure, the encapsulant includes a third cavity, for example.

According to the aforesaid package structure, an anode and a cathode of the light-emitting device are electrically connected to the second lead and to the first lead, respectively. On the contrary, the anode and the cathode of the ESD protection device are electrically connected to the first lead and to the second lead, respectively.

In the present invention, the light-emitting device and the ESD protection device are respectively placed into different cavities, so as to prevent the ESD protection device from blocking the light emitted by the light-emitting device. Thus, the package structure of the present invention achieves desirable luminance efficiency in comparison with the package structure in the prior art.

In order to make the aforementioned and other objects, features and advantages of the present invention more comprehensible, preferred embodiments accompanied with figures are described in detail below.

DESCRIPTION OF EMBODIMENTS

Figure 1A:
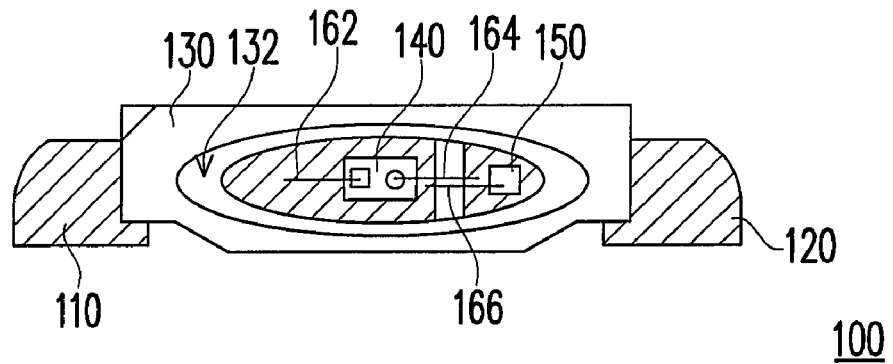
FIG. 1A is a top view depicting a conventional LED package structure.
Figure 1B:
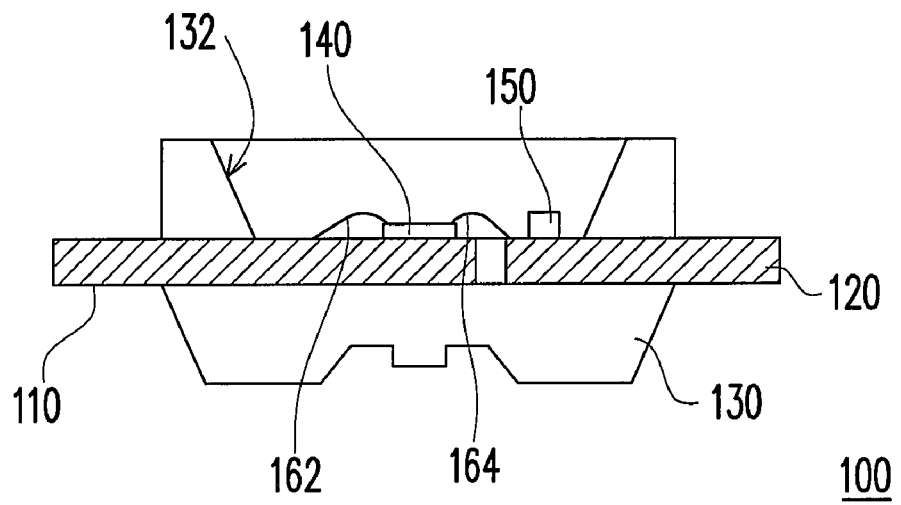
FIG. 1B is a cross-sectional view depicting the LED package structure of FIG. 1A.
Figure 2A:
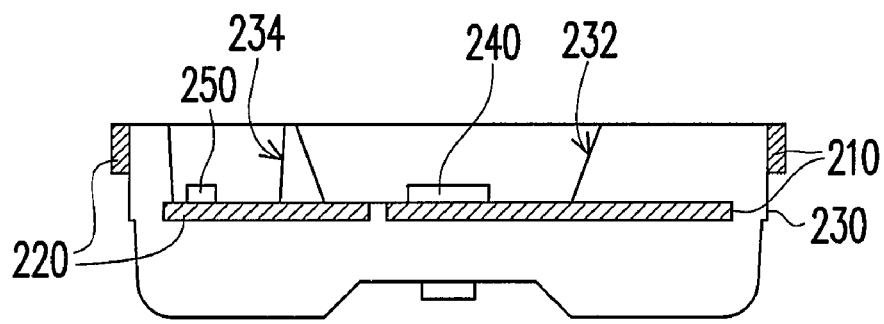
FIG. 2A is a cross-sectional schematic view depicting a package structure according to one embodiment of the present invention.
Figure 2B:
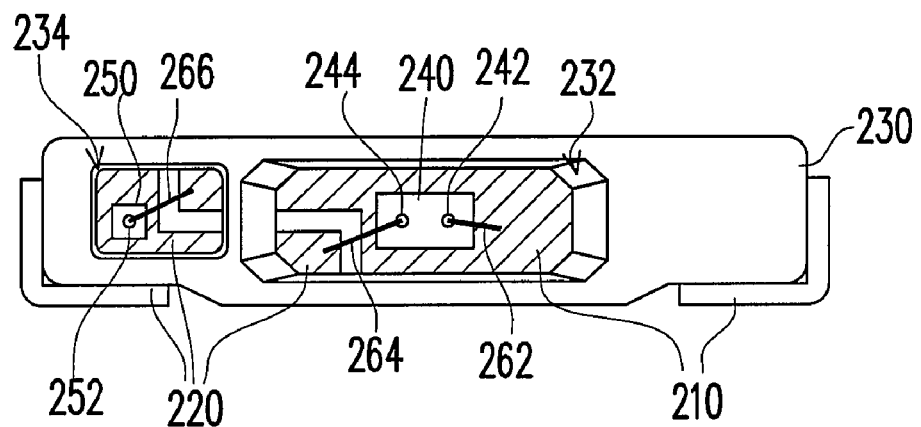
FIG. 2B is a top view depicting the package structure of FIG. 2A.

FIG. 2A is a cross-sectional schematic view depicting a package structure according to one embodiment of the present invention, while FIG. 2B is a top view depicting the package structure of FIG. 2A. Referring to FIGS. 2A and 2B, the package structure 200 of the present embodiment includes a first lead 210, a second lead 220, an encapsulant 230, a light-emitting device 240, and an electrostatic discharge (ESD) protection device 250. The second lead 220 is disposed beside the first lead 210, and parts of the first lead 210 and the second lead 220 are packaged by the encapsulant 230. The encapsulant 230 has a first cavity 232 and a second cavity 234. Here, parts of the first lead 210 and the second lead 220 are exposed by the first cavity 232, and the other parts of the first lead 210 and the second lead 220 are exposed by the second cavity 234. In addition, the light-emitting device 240 is disposed inside the first cavity 232 and electrically connected to the first lead 210 and the second lead 220. The ESD protection device 250 is disposed inside the second cavity 234 and electrically connected to the first lead 210 and the second lead 220.

In said package structure 200, the material of the first lead 210 and the second lead 220 is metal, for example. And a method of forming the package compound 230 includes injection molding or punching. The light-emitting device 240 is, for example, disposed on the first lead 210 within the first cavity 232, while the ESD protection device 250 is, for example, disposed on the second lead 220 within the second cavity 234. Moreover, a first contact pad 242 and a second contact pad 244 are disposed on a top of the light-emitting device 240. Here, the first contact pad 242 is, for example, electrically connected to the first lead 210 through a wire 262 connected between the first contact pad 242 and the first lead 210. The second contact pad 244 is, for example, electrically connected to the second lead 220 through a wire 264 connected between the second contact pad 244 and the second lead 220. On the other hand, a third contact pad (not shown) and a fourth contact pad 252 are respectively disposed on a bottom and a top of the ESD protection device 250. Here, the third contact pad is in direct contact with the second lead 220, and the fourth contact pad 252 is, for example, electrically connected to the first lead 210 through the wire 266 connected between the fourth contact pad 252 and the first lead 210.

The first contact pad 242 and the second contact pad 244 of the light-emitting device 240 are, for example, the cathode and the anode, respectively. The third contact pad and the fourth contact pad 252 of the ESD protection device 250 are, for example, the cathode and the anode, respectively. In other words, the cathode and the anode of the light-emitting device 240 are electrically connected to the first lead 210 and to the second lead 220, respectively. The cathode and the anode of the ESD protection device 250 are electrically connected to the second lead 220 and to the first lead 210, respectively. Furthermore, the wires 262, 264 and 266 are, for example, gold wires, aluminum wires, or other appropriate metal wires. The light-emitting device 240 is, for example, an LED chip, and the ESD protection device 250 includes but not limited to a diode, such as a Zener diode or an LED.

According to the present embodiment, the light-emitting device 240 and the ESD protection device 250 are respectively placed into different cavities, so as to prevent the ESD protection device 250 from blocking the light emitted by the light-emitting device 240. Thus, the package structure of the present embodiment achieves desirable luminance efficiency in comparison with the package structure in the prior art.

In spite of the fact that the first contact pad 242 and the second contact pad 244 are both disposed on the top of the light-emitting device 240 according to the present embodiment, the two contact pads can also be respectively disposed on the top and the bottom of the light-emitting device 240 according to the present invention. In addition, the package structure 200 of the present embodiment may be a surface mount device (SMD) LED package structure or a top view LED package structure.

Figure 3:
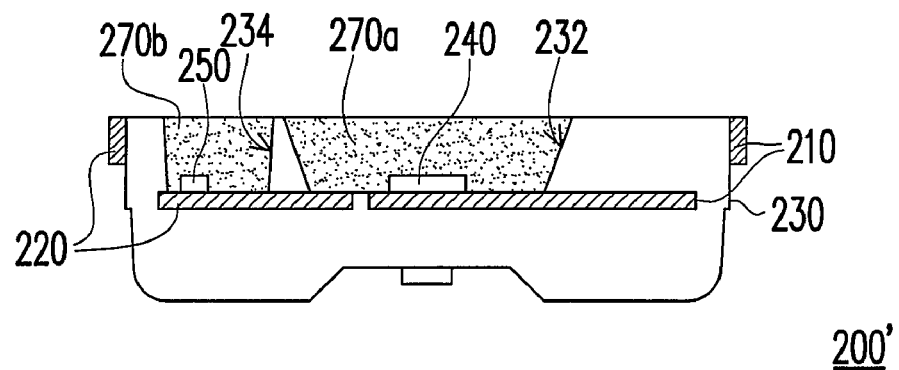
FIG. 3 is a cross-sectional schematic view depicting a package structure according to another embodiment of the present invention.

FIG. 3 is a cross-sectional schematic view depicting a package structure according to another embodiment of the present invention. Referring to FIG. 3, the package structure 200' of the present embodiment is similar to said package structure 200. The difference lies in that the package structure 200' further includes a compound 270a encapsulating the first cavity 232 and a compound 270b encapsulating the second cavity 234. The compounds 270a and 270b are utilized to shield the light emitting device 240 and the ESD protection device 250. Besides, the compound 270a is, for example, a transparent compound, and the top shape thereof may be in a convex shape, a concave shape, or other shapes based on desired radiation patterns.

Figure 4:
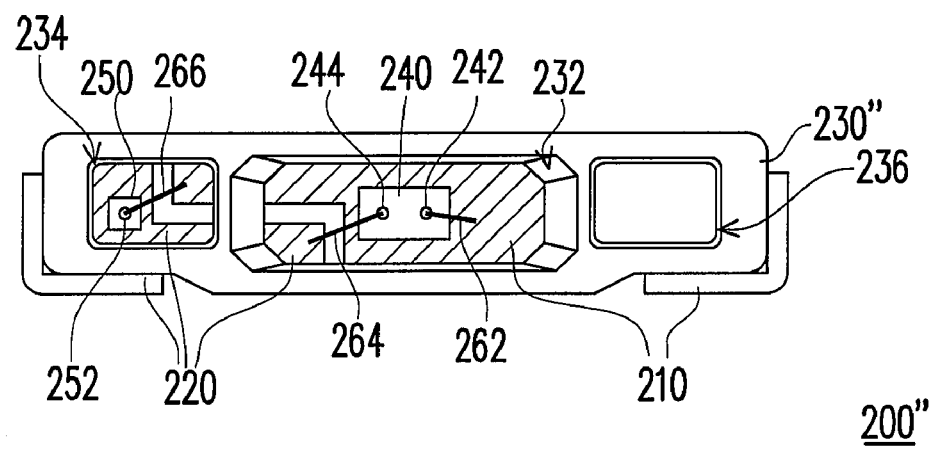
FIG. 4 is a top view depicting a package structure according to still another embodiment of the present invention.

FIG. 4 is a top view depicting a package structure according to still another embodiment of the present invention. Referring to FIG. 4, the package structure 200" of the present embodiment is similar to said package structure 200. The difference lies in that the package structure 200" further includes a third cavity 236 in which other devices can be disposed. Moreover, the present invention does not include any limitation to the number of the cavities.

In summary, according to the package structure of the present invention, the ESD protection device does not block the light emitted by the light-emitting device, for the light-emitting device and the ESD protection device are respectively disposed in different cavities rather than in the same cavity. Thus, the package structure of the present invention achieves desirable luminance efficiency in comparison with the package structure in the prior art.

Although the invention has been described with reference to a particular embodiment thereof, it will be apparent to one of the ordinary skills in the art that modifications to the described embodiment may be made without departing from the spirit of the invention. Accordingly, the scope of the invention will be defined by the attached claims not by the above detailed description.

What is claimed is:

1. A package structure, comprising:
   a first lead;
   a second lead disposed beside the first lead;
   an encapsulant encapsulating parts of the first lead and the second lead, wherein the encapsulant comprises a first cavity and a second cavity, the first cavity and the second cavity being located on a same side of the encapsulant, the first cavity exposing parts of the first lead and the second lead, the second cavity exposing the other parts of the first lead and the second lead;
   a light-emitting device disposed inside the first cavity and electrically connected to the first lead and the second lead; and
   an electrostatic discharge (ESD) protection device disposed inside the second cavity and electrically connected to the first lead and the second lead.

2. The package structure of claim 1, wherein the light-emitting device is disposed on the first lead and the ESD protection device is disposed on the second lead.

3. The package structure of claim 2, further comprising two wires, a first contact pad and a second contact pad being disposed on a top of the light-emitting device, wherein the wires are connected between the first contact pad and the first lead and connected between the second contact pad and the second lead.

4. The package structure of claim 2, further comprising a wire, a third contact pad and a fourth contact pad being respectively disposed on a bottom and a top of the ESD protection device, wherein the third contact pad is in contact with the second lead and the wire is connected between the fourth contact pad and the first lead.

5. The package structure of claim 1, wherein the ESD protection device is a diode.

6. The package structure of claim 5, wherein the diode is a light emitting diode (LED).

7. The package structure of claim 1, wherein the light-emitting device is an LED chip.

8. The package structure of claim 1, further comprising a compound encapsulating the first cavity.

9. The package structure of claim 1, further comprising a compound encapsulating the second cavity.

10. The package structure of claim 1, wherein the encapsulant further comprises a third cavity.

11. The package structure of claim 1, wherein an anode and a cathode of the light-emitting device are electrically connected to the second lead and to the first lead respectively, and the anode and the cathode of the ESD protection device are electrically connected to the first lead and to the second lead respectively.

* * * * *